United States Patent
Chang et al.

(10) Patent No.: US 12,200,900 B2
(45) Date of Patent: Jan. 14, 2025

(54) ELECTRONIC DEVICE WITH HEAT-CONDUCTIVE COVER

(71) Applicant: HTC Corporation, Taoyuan (TW)

(72) Inventors: Li-Hsun Chang, Taoyuan (TW);
Kuan-Ying Ou, Taoyuan (TW);
Wei-Jen Chen, Taoyuan (TW)

(73) Assignee: HTC Corporation, Taoyuan (TW)

( * ) Notice: Subject to any disclaimer, the term of this patent is extended or adjusted under 35 U.S.C. 154(b) by 472 days.

(21) Appl. No.: 17/386,540

(22) Filed: Jul. 28, 2021

(65) Prior Publication Data

US 2022/0157781 A1    May 19, 2022

Related U.S. Application Data

(60) Provisional application No. 63/114,533, filed on Nov. 17, 2020.

(51) Int. Cl.
*H05K 7/20* (2006.01)
*H01L 25/065* (2023.01)
(Continued)

(52) U.S. Cl.
CPC ..... *H05K 7/20218* (2013.01); *H01L 25/0657* (2013.01); *H05K 1/0203* (2013.01); *H05K 7/20236* (2013.01); *H05K 7/2039* (2013.01); *H05K 7/205* (2013.01); *H01L 23/427* (2013.01); *H05K 7/20136* (2013.01); *H05K 7/20336* (2013.01)

(58) Field of Classification Search
CPC ............... H05K 7/20236; H05K 7/203; H01L 23/34–4735
See application file for complete search history.

(56) References Cited

U.S. PATENT DOCUMENTS 5,777,844 A * 7/1998 Kiefer ............... H05K 7/142
361/720
6,188,578 B1   2/2001 Lin et al.
(Continued)

FOREIGN PATENT DOCUMENTS

CN    109564907    4/2019
CN    210899984    6/2020
(Continued)

OTHER PUBLICATIONS

"Office Action of Taiwan Counterpart Application", issued on Jan. 6, 2021, p. 1-p. 6.
(Continued)

*Primary Examiner* — Zachary Pape
(74) *Attorney, Agent, or Firm* — JCIPRNET

(57) ABSTRACT

An electronic device includes a circuit board, a package on package structure, a heat-conducting cover, and a heat-conducting fluid. The circuit board has a first surface and a second surface opposite to each other. The package on package structure is disposed on the first surface. The package on package structure has at least one heat generating element. The heat-conducting cover is disposed on the second surface and is in thermal contact with the circuit board. The heat-conducting cover and the second surface form an enclosed space. The heat-conducting fluid is filled in the enclosed space.

7 Claims, 3 Drawing Sheets

(51) Int. Cl.
*H05K 1/02* (2006.01)
*H01L 23/427* (2006.01)

(56) References Cited

U.S. PATENT DOCUMENTS

| | | | |
|---|---|---|---|
| 6,707,671 B2 | 3/2004 | Yamashita et al. | |
| 7,209,354 B2 | 4/2007 | Wu et al. | |
| 9,330,999 B2* | 5/2016 | Fitzgerald | H01L 21/50 |
| 9,408,291 B2* | 8/2016 | Ott | H05K 5/062 |
| 9,781,863 B1* | 10/2017 | Kim | H01L 23/053 |
| 2008/0128897 A1* | 6/2008 | Chao | H01L 25/0655 |
| | | | 257/713 |
| 2009/0296418 A1* | 12/2009 | Luo | F21S 43/19 |
| | | | 362/509 |
| 2012/0098119 A1* | 4/2012 | Refai-Ahmed | H01L 25/115 |
| | | | 438/109 |
| 2016/0037680 A1 | 2/2016 | Hou et al. | |
| 2020/0294917 A1* | 9/2020 | Lee | H01L 24/19 |

FOREIGN PATENT DOCUMENTS

| | | |
|---|---|---|
| TW | 201709807 | 3/2017 |
| TW | 201824981 | 7/2018 |

OTHER PUBLICATIONS

"PlayStation 4 Pro Teardown", with English translation, retrieved from "https://www.ifixit.com/Teardown/PlayStation+4+Pro+Teardown/72946".

"PlayStation 5 Teardown", with English translation, retrieved from "https://www.ifixit.com/Teardown/PlayStation+5+Teardown/138280".

\* cited by examiner

ELECTRONIC DEVICE WITH HEAT-CONDUCTIVE COVER

CROSS-REFERENCE TO RELATED APPLICATION

This application claims the priority benefit of U.S. Provisional Application No. 63/114,533, filed on Nov. 17, 2020. The entirety of the above-mentioned patent application is hereby incorporated by reference herein and made a part of this specification.

TECHNICAL FIELD

This application relates to an electronic device, and particularly relates to an electronic device with a heat dissipation means.

DESCRIPTION OF RELATED ART

Package on package (POP) technology has gradually become a commonly used technology because of its small size and good performance. However, in a case where a high-power chip such as a central processing unit adopts the package on package technology, a memory chip may be disposed above the central processing unit. When the central processing unit is in a high calculation state, the central processing unit may generate a great amount of heat, and the memory chip located above the central processing unit may affect the heat dissipation efficiency of the central processing unit, thereby causing performance reduction of, or even damage to, the central processing unit.

SUMMARY

This application provides an electronic device in which an issue of poor heat dissipation efficiency of a package on package structure can be improved.

The electronic device of this application includes a circuit board, a package on package structure, a heat-conducting cover, and a heat-conducting fluid. The circuit board has a first surface and a second surface opposite to each other. The package on package structure is disposed on the first surface. The package on package structure has at least one heat generating element. The heat-conducting cover is disposed on the second surface and is in thermal contact with the circuit board. The heat-conducting cover and the second surface form an enclosed space. The heat-conducting fluid is filled in the enclosed space.

Based on the foregoing, in the electronic device of this application, a heat dissipation means formed by the heat-conducting cover and the heat-conducting fluid is disposed on the back of the circuit board, which can improve the heat dissipation efficiency of the package on package structure.

DESCRIPTION OF THE EMBODIMENTS

Figure 1:
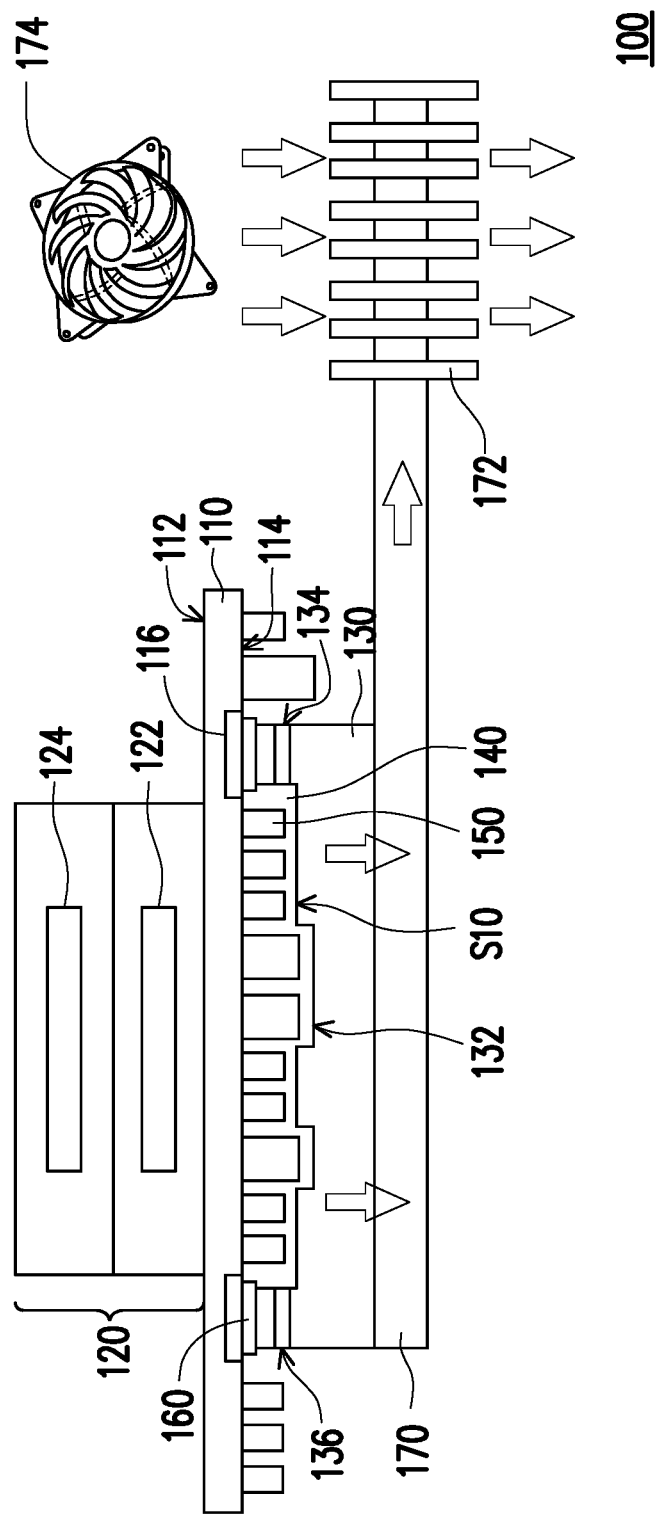
FIG. 1 is a schematic cross-sectional view of an electronic device according to an embodiment of the disclosure.

FIG. 1 is a schematic cross-sectional view of an electronic device according to an embodiment of the disclosure. With reference to FIG. 1, an electronic device 100 of this embodiment includes a circuit board 110, a package on package structure (POP structure) 120, a heat-conducting cover 130, and a heat-conducting fluid 140. The circuit board 110 has a first surface 112 and a second surface 114 opposite to each other. The package on package structure 120 is disposed on the first surface 112. The package on package structure 120 has at least one heat generating element 122. The heat-conducting cover 130 is disposed on the second surface 114 and is in thermal contact with the circuit board 110. The heat-conducting cover 130 and the second surface 114 form an enclosed space S10. The heat-conducting fluid 140 is filled in the enclosed space S10.

In the electronic device 100 of this embodiment, the circuit board 110, the heat-conducting cover 130, and the heat-conducting fluid 140 form a heat dissipation means similar to a vapor chamber formed by two heat-conducting plates and a heat-conducting fluid therein. Compared with the additionally disposed the vapor chamber, the electronic device 100 of this embodiment has a less overall thickness. Besides, the combination of the heat-conducting cover 130 and the heat-conducting fluid 140 also exhibits a good heat dissipation effect.

In this embodiment, the heat generating element 122 is a central processing unit, but may also be an image processing chip or other high-power chips. Besides, the package on package structure 120 may further have a chip 124 disposed on the heat generating element 122. In this embodiment, the chip 124 may be a memory chip or other types of chips. In this embodiment, the chips 124 may include one chip or a plurality of chips, and the plurality of chips 124 may be arranged side by side or stacked on the heat generating element 122. The electronic device 100 of this embodiment may further include a plurality of electronic components 150 disposed on the second surface 114 and located in the enclosed space S10. In this embodiment, the electronic components 150 may be chips or passive elements, and the passive elements may be resistors, capacitors, or inductors. In other words, the conventional heat sink or vapor chamber may be affected by the electronic components 150 and thus cannot be used. However, the heat-conducting fluid 140 is filled between the electronic components 150. Therefore, the size of the area available for the electronic components 150 to be disposed on the second surface 114 of the circuit board 110 is not greatly affected by the disposed heat-conducting cover 130. The heat-conducting fluid 140 filled between the electronic components 150 may still quickly dissipate heat to prevent damage caused by a local high temperature. In this embodiment, the heat-conducting fluid 140 has a high thermal conductivity coefficient and an electrical insulation property. The heat-conducting fluid 140 is not limited to water, and may also be other fluids having a high thermal conductivity coefficient, as long as it is likely to be reliably filled in the enclosed space S10. For example, a thermal paste or a phase change material may also serve as the heat-conducting fluid 140.

To be more specific, since the chip 124 is disposed on the heat generating element 122, heat generated by the heat generating element 122 is not easily transferred to the external environment through the chip 124. In this embodiment, since the heat-conducting cover 130 is disposed below the heat generating element 122 and filled with the heat-conducting fluid 140, the heat generated by the heat generating element 122 is relatively easily transferred to the heat-conducting cover 130 and the heat-conducting fluid 140 through the internal circuits of the circuit board 110. Besides, the electronic components 150 also facilitate heat dissipation and increase the contact area with the heat-conducting fluid 140. When the heat generating element 122 instantly increases power or calculation speed, the heat generating element 122 instantly generates more heat energy, that is, thermal impact. The heat-conducting fluid 140 and the heat-conducting cover 130 of this embodiment quickly absorb heat energy to reduce the influence by thermal impact. In other words, when the heat generating element 122 instantly increases power or calculation speed, the local temperature does not rise overly high, and the influence on the service life of the package on package structure 120 is reduced.

In this embodiment, an inner surface 132 of the heat-conducting cover 130 located in the enclosed space S10 and opposite to the second surface 114 is non-planar. When heights of the electronic components 150 are inconsistent, it may be configured that a distance is kept between the inner surface 132 and the electronic components 150. Therefore, a thermal resistance between the heat-conducting cover 130 and the electronic components 150 can be reduced, helping to increase the heat dissipation efficiency. To be more specific, the distance between the heat-conducting cover 130 and the electronic components 150 may affect the thermal resistance. As the distance decreases, the thermal resistance decreases, and the heat dissipation efficiency increases. However, too close a distance may increase the probability of a short circuit generated by contact between the electronic components and the heat-conducting cover 130. Therefore, the distance between the inner surface 132 and the electronic components 150 is preferred to be shortest possible without causing a short circuit.

In this embodiment, the heat-conducting cover 130 has an inlet 134 and an outlet 136. The inlet 134 is used for the heat-conducting fluid 140 to be filled in the enclosed space S10, and the outlet 136 is used for air and excess of the heat-conducting fluid 140 to flow out. During assembly, for example, the heat-conducting cover 130 is first bonded to the second surface 114 of the circuit board 110, and then, the heat-conducting fluid 140 is filled from the inlet 134 into the enclosed space S10. During this process, air in the enclosed space S10 may be discharged from the outlet 136. When the heat-conducting fluid 140 also flows out of the outlet 136, it can be determined that the enclosed space S10 should have been fully filled with the heat-conducting fluid 140. At this time, the inlet 134 and the outlet 136 may be closed to enclose the heat-conducting fluid 140 in the enclosed space S10. In another embodiment, it is also possible that a large amount of heat-conducting fluid 140 with poor fluidity is first disposed on the second surface 114, and then the heat-conducting fluid 140 is directly covered with the heat-conducting cover 130, which in the meantime is bonded to the circuit board 110, thus enclosing the heat-conducting fluid 140 in the enclosed space S10.

In this embodiment, the circuit board 110 has a grounding pattern 116 exposed from the second surface 114. The heat-conducting cover 130 is in thermal contact with the grounding pattern 116. The material of the grounding pattern 116 of this embodiment includes copper, for example. Since it is originally intended the package on package structure 120 is connected to the grounding circuit in the circuit board 110, the heat generated by the package on package structure 120 may also be transferred to the heat-conducting cover 130 through grounding circuits and the grounding pattern 116, thereby increasing the heat dissipation efficiency. Besides, multiple grounding layers may also be disposed in the circuit board 110 to increase the heat dissipation efficiency.

In this embodiment, the electronic device 100 further includes a heat-conducting soft pad 160 disposed between the heat-conducting cover 130 and the second surface 114, such that the heat-conducting cover 130 is in thermal contact with the circuit board 110. When the heat-conducting cover 130 cannot be closely fitted with the second surface 114 due to poor flatness, the heat-conducting soft pad 160 can prevents generation of a relatively great thermal resistance due to existence of gaps between the heat-conducting cover 130 and the second surface 114. Similarly, the heat-conducting soft pad 160 may also be disposed between the grounding pattern 116 exposed by the circuit board 110 and the heat-conducting cover 130 to increase the heat dissipation efficiency.

In this embodiment, the orthogonal projection of the package on package structure 120 on the second surface 114 is completely covered by the orthogonal projection of the heat-conducting cover 130 on the second surface 114. That is, when being viewed from a direction perpendicular to the second surface 114, the package on package structure 120 is completely located within the range of the heat-conducting cover 130. Since the shortest heat transfer path may be obtained from such an arrangement, the heat dissipation efficiency will also be better. However, in other embodiments where there are other design considerations, it is also possible that the orthogonal projection of the package on package structure 120 on the second surface 114 is only partially overlapped with the orthogonal projection of the heat-conducting cover 130 on the second surface 114, but the application is not limited thereto.

Besides, the electronic device 100 of this embodiment may include a heat pipe 170, a heat dissipation fin 172, and a fan 174, but the application is not limited thereto. The heat pipe 170 is in thermal contact with the heat-conducting cover 130. The heat dissipation fin 172 is in thermal contact with the heat pipe 170. The fan 174 dissipates heat from the heat dissipation fin 172. In other words, in this embodiment, various combinations of the heat pipe 170, the heat dissipation fin 172, and the fan 174 may also be adopted and may be in thermal contact with the heat-conducting cover 130 to increase the heat dissipation efficiency.

Figure 2:
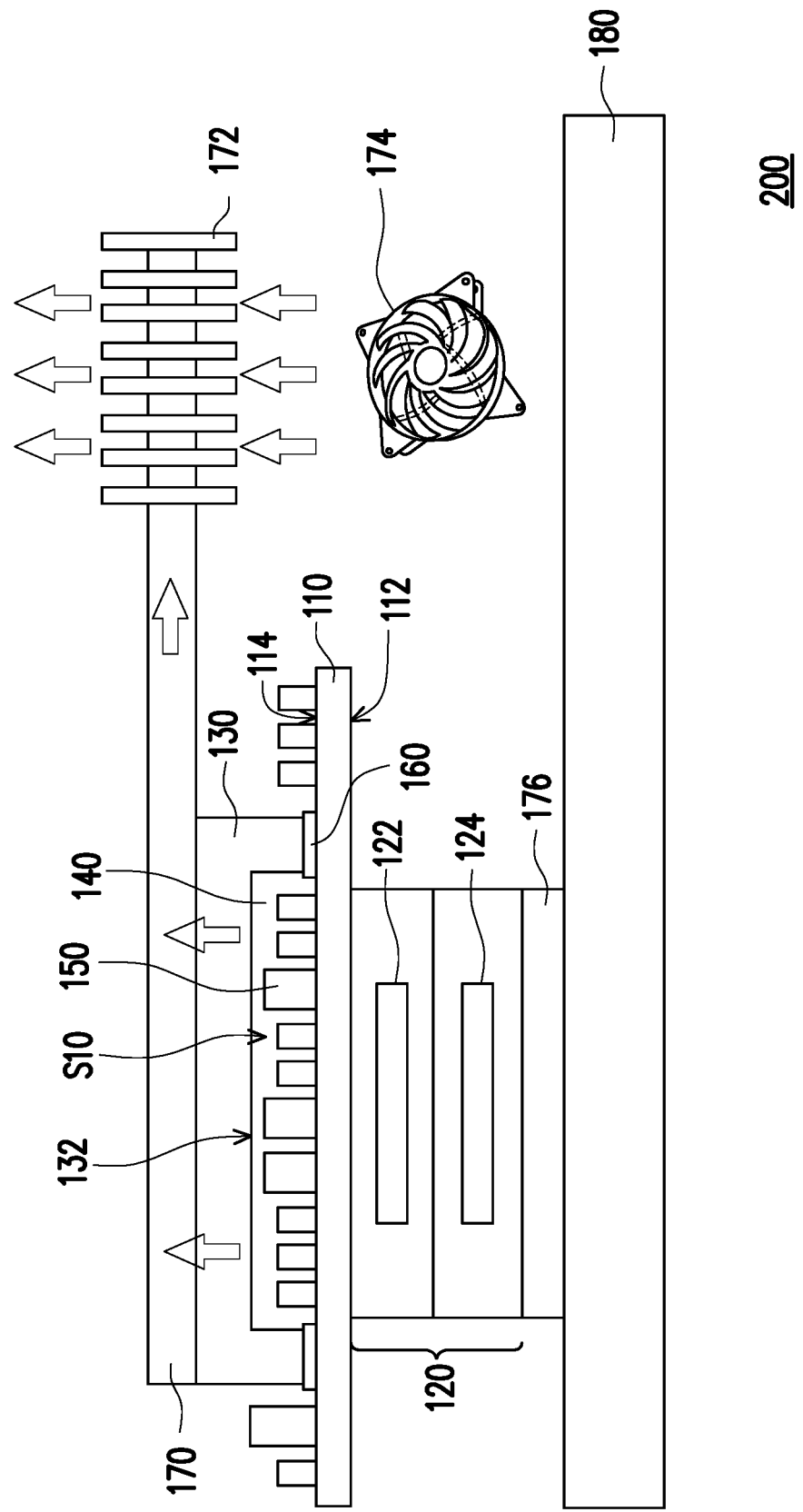
FIG. 2 is a schematic cross-sectional view of an electronic device according to another embodiment of the disclosure.

FIG. 2 is a schematic cross-sectional view of an electronic device according to another embodiment of the disclosure. With reference to FIG. 2, an electronic device 200 of this embodiment is generally the same as the electronic device 100 of FIG. 1. The difference lies in that the electronic device 200 further includes a heat dissipation pad 176 and a bracket 180. The package on package structure 120 is in thermal contact with the bracket 180 through the heat dissipation pad 176. Similarly, in this embodiment, various combinations of the heat pipe 170, the heat dissipation fin 172, and the fan 174 may also be adopted and may be in thermal contact with the heat-conducting cover 130 to increase the heat dissipation efficiency. The bracket 180 may be an element serving as the main support structure in the electronic device 200, or it may as well be the housing or other elements with good thermal conductivity of the electronic device 200.

Figure 3:
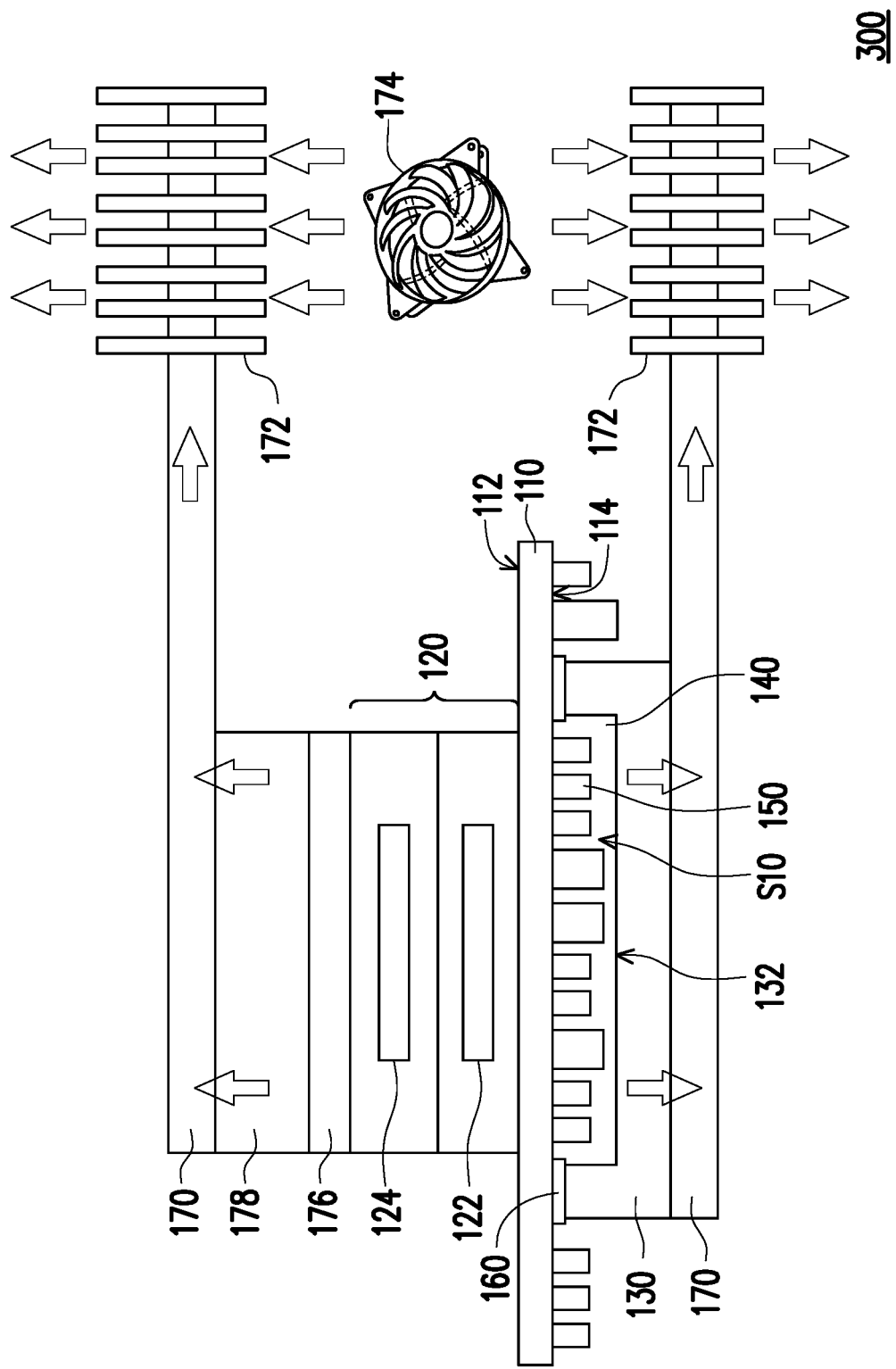
FIG. 3 is a schematic cross-sectional view of an electronic device according to still another embodiment of the disclosure.

FIG. 3 is a schematic cross-sectional view of an electronic device according to still another embodiment of the disclosure. With reference to FIG. 3, an electronic device 300 of this embodiment is generally the same as the electronic device 100 of FIG. 1. The difference lies in that the electronic device 300 further includes a heat dissipation pad 176, a heat dissipation device 178, another heat pipe 170, and another heat dissipation fin 172. The heat dissipation device 178 is in thermal contact with the package on package structure 120 through the heat dissipation pad 176. The another heat pipe 170 is in thermal contact with the heat dissipation device 178. The another heat dissipation fin 172 is in thermal contact with the another heat pipe 170. The fan 174 dissipates heat from the two heat dissipation fin 172. Similarly, in this embodiment, various combinations of the heat pipe 170, the heat dissipation fin 172, the fan 174, the heat dissipation pad 176, and the heat dissipation device 178 may also be adopted and may be in thermal contact with the heat-conducting cover 130 to increase the heat dissipation efficiency.

In summary of the foregoing, in the electronic device of this application, a heat dissipation means formed by the heat-conducting cover and the heat-conducting fluid is disposed on the back of the circuit board, in which heat dissipation may be performed on the heat generating element 122 from the other side of the package on package structure, effectively improving the heat dissipation efficiency of the package on package structure.

What is claimed is:

1. An electronic device, comprising:
    a circuit board, having a first surface and a second surface opposite to each other;
    a package on package structure, disposed on the first surface, wherein the package on package structure has at least one heat generating element;
    a heat-conducting cover, disposed on the second surface and in thermal contact with the circuit board, wherein the heat-conducting cover and the second surface form an enclosed space, an orthogonal projection of the package on package structure on the second surface is at least partially overlapped with an orthogonal projection of the heat-conducting cover on the second surface;
    a heat-conducting fluid, filled in the enclosed space; and
    a plurality of electronic components, directly disposed on the second surface and located in the enclosed space, wherein the heat-conducting fluid is filled between the electronic components, an inner surface of the heat-conducting cover located in the enclosed space and opposite to the second surface is non-planar, heights of the electronic components are inconsistent, and a distance between one of the electronic components and the inner surface is equal to a distance between another one of the electronic components and the inner surface,
    wherein heat generated by the heat generating element is transferred to the heat-conducting cover and the heat-conducting fluid through internal circuits of the circuit board.

2. The electronic device described in claim 1, wherein the heat-conducting cover has an inlet and an outlet, the inlet is used for the heat-conducting fluid to be filled in the enclosed space, and the outlet is used for air and excess of the heat-conducting fluid to flow out the enclosed space.

3. The electronic device described in claim 1, wherein the circuit board has a grounding pattern exposed from the second surface, and the heat-conducting cover is in thermal contact with the grounding pattern.

4. The electronic device described in claim 3, wherein a material of the grounding pattern comprises copper.

5. The electronic device described in claim 1, further comprising a heat-conducting soft pad disposed between the heat-conducting cover and the second surface, such that the heat-conducting cover is in thermal contact with the circuit board.

6. The electronic device described in claim 1, wherein the orthogonal projection of the package on package structure on the second surface is completely covered by the orthogonal projection of the heat-conducting cover on the second surface.

7. The electronic device described in claim 1, wherein the package on package structure further has a chip disposed on the heat generating element.

\* \* \* \* \*